US009735759B1

United States Patent
Diaz et al.

(10) Patent No.: US 9,735,759 B1
(45) Date of Patent: Aug. 15, 2017

(54) SYSTEMS AND METHODS FOR MITIGATING NOISE IN AN ELECTRONIC DEVICE

(71) Applicant: MOTOROLA SOLUTIONS, INC., Schaumburg, IL (US)

(72) Inventors: Edward A. Diaz, Astoria, NY (US); Johnny R. Ferreira, Sunrise, FL (US); Ricardo Franco, Plantation, FL (US); Charles R. Ruelke, Coral Springs, FL (US); Richard S. Young, Weston, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/095,644

(22) Filed: Apr. 11, 2016

(51) Int. Cl.
| H03K 3/00 | (2006.01) |
| H03K 3/013 | (2006.01) |
| H03K 3/66 | (2006.01) |
| H03K 5/1534 | (2006.01) |

(52) U.S. Cl.
CPC ............. *H03K 3/013* (2013.01); *H03K 3/66* (2013.01); *H03K 5/1534* (2013.01)

(58) Field of Classification Search
CPC ...... H04J 3/0667; H04J 3/0697; H04J 3/0673; H04J 3/0638; G06F 1/12
See application file for complete search history.

(56) References Cited

U.S. PATENT DOCUMENTS

| 6,215,432 | B1 | 4/2001 | Tann |
| 9,083,338 | B2 | 7/2015 | Cauli et al. |
| 9,128,499 | B2 | 9/2015 | Nene |
| 2004/0135614 | A1* | 7/2004 | Xiao ............ H03K 5/156 327/291 |
| 2009/0282316 | A1* | 11/2009 | Lingam ........... H03M 13/11 714/763 |

OTHER PUBLICATIONS

Atmel Corporation, "AVR126: ADC of megaAVR in Single Ended Mode," article (2016) 16 pages, Rev. 8444A-AVR-10/11, http://www.atmel.com/Images/Atmel-8444-ADC-of-megaAVR-in-Single-Ended-Mode_ApplicationNote_AVR126.pdf.

* cited by examiner

*Primary Examiner* — Sibin Chen
(74) *Attorney, Agent, or Firm* — Michael Best & Friedrich LLP

(57) ABSTRACT

A method and apparatus for mitigating electromagnetic noise in an electronic device. The method includes generating a trigger clock signal at a first frequency, and generating a second clock signal at a second frequency. The second frequency is higher than the first frequency. The method also includes receiving an input signal with a converter circuit, detecting an event based on the trigger clock signal, and predicting a time for a conversion of the input signal based on the detected event. The method further includes blanking the second clock signal for a predetermined period based on the predicted time for a conversion.

18 Claims, 4 Drawing Sheets

US 9,735,759 B1

SYSTEMS AND METHODS FOR MITIGATING NOISE IN AN ELECTRONIC DEVICE

BACKGROUND OF THE INVENTION

Mixed-signal integrated circuits typically include radio frequency (RF) receivers and/or transmitters as well as digital subsystems. Often radio frequency receivers and/or transmitters digitize small-signal analog time domain waveforms for use in digital subsystems of the mixed-signal integrated circuit. However, high-speed processor clocks and internal digital communications of the digital subsystems may generate digital switching noise that interferes with the digitization of the small-signal analog signals. Additionally, stray capacitances intrinsic to some of the materials used during the integrated circuit fabrication process may also generate noise that interferes with the digitization of the small-signal analog signals. Some radio frequency receivers may also be sensitive to noise from power components of the mixed-signal integrated circuits.

Noise and other electromagnetic interference may bias analog samples of small-signal waveforms and, therefore, degrade the signal-to-noise ratio of the radio frequency receivers and/or transmitters. The noise and other electromagnetic interference may also degrade mask compliance of the radio frequency transmitter and may increase the bit error rate. Mask compliance generally reduces adjacent-channel interference by limiting transmissions at frequencies outside a particular bandwidth.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
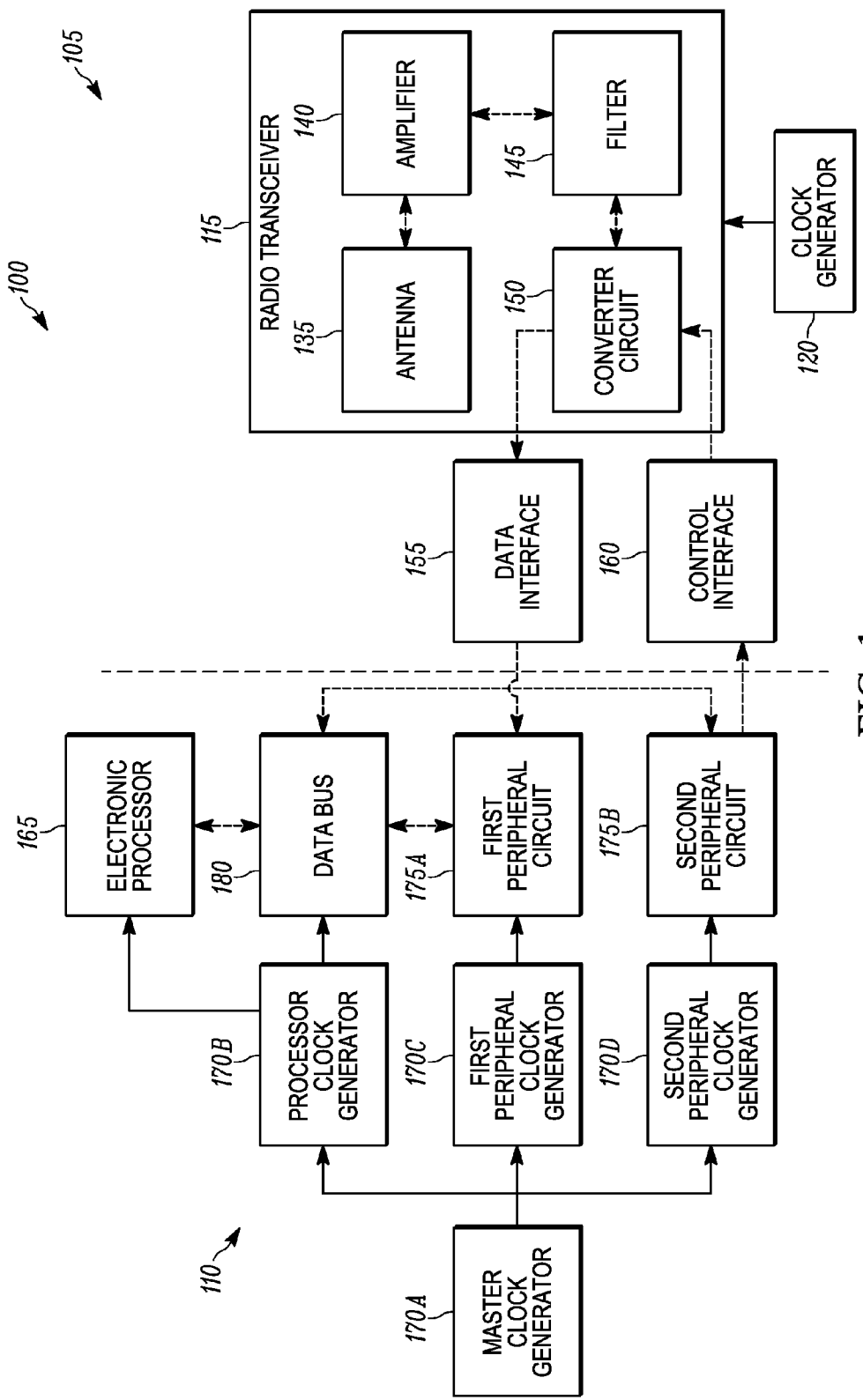
FIG. 1 is a block diagram of a mixed-signal electronic circuit in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One exemplary embodiment provides a method of mitigating electromagnetic noise in an electronic device. The method includes generating a trigger clock signal at a first frequency and generating a second clock signal at a second frequency. The second frequency is higher than the first frequency. The method also includes receiving an input signal with a converter circuit, detecting an event based on the trigger clock signal, and predicting a time for a conversion of the input signal based on the detected event. The method further includes blanking the second clock signal for a predetermined period based on the predicted time for the conversion.

Another exemplary embodiment provides a mixed-signal circuit including a first clock generator, a converter circuit, and a second clock generator. The first clock generator is configured to generate a trigger clock signal at a first frequency. The converter circuit is configured to receive an input signal. The second clock generator is configured to generate a second clock signal at a second frequency, and detect an event based on the trigger clock signal. The second frequency is higher than the first frequency. The second clock generator is also configured to predict a time for a conversion of the input signal based on the detected event, and blank the second clock signal for a predetermined period based on the predicted time for the conversion.

FIG. 1 is a block diagram of a mixed-signal electronic circuit 100 according to one exemplary embodiment. In the example illustrated, the mixed-signal electronic circuit 100 includes an analog circuit portion 105 and a digital circuit portion 110. The analog circuit portion 105 includes circuit components that receive, transmit, and/or process analog signals. Operation of the analog circuit portion 105 may be adversely impacted by electromagnetic noise, for example, from the digital circuit portion 110. Techniques and mechanisms for reducing these adverse impacts are discussed in greater detail herein.

In the example of FIG. 1, the analog circuit portion 105 includes a radio transceiver 115 driven by a clock generator 120 (for example, a first clock generator). The radio transceiver 115 includes an antenna 135, an amplifier 140, a filter 145, and a converter circuit 150. In other embodiments, the analog circuit portion 105 may include more or less components than those shown in FIG. 1.

When the radio transceiver 115 operates as a radio receiver, the antenna 135 receives input analog signals (for example, radio signals) external from the mixed-signal electronic circuit 100. The amplifier 140 and the filter 145 then process the input analog signals (that is, amplify and filter the input analog signals). The converter circuit 150 then digitizes the input analog signals.

When the radio transceiver 115 operates as a radio transmitter, the converter circuit 150 receives a digital signal and converts the digital signal to an analog signal. The amplifier 140 and the filter 145 then amplify and filter the analog signal. The antenna 135 then transmits the analog signal to external devices and/or circuits.

Digitized signals from the converter circuit 150 may then be transmitted to the digital circuit portion 110 via a data interface 155. The analog circuit portion 105 also receives digital control signals (for example, indicating when to transmit a message via the radio transceiver 115) from the digital circuit portion 110 through a control interface 160. The clock generator 120 generates a trigger clock signal (such as, for example, the trigger clock signal 200 shown in FIG. 2) to drive the radio transceiver 115.

The digital circuit portion 110 includes an electronic processor 165 (e.g., a microprocessor or another suitable programmable device), a master clock generator 170a, a processor clock generator 170b, a first peripheral clock generator 170c (for example, a second clock generator), and a second peripheral clock generator 170d. The digital circuit portion 110 also includes a first peripheral circuit 175a and a second peripheral circuit 175b. The electronic processor 165, the first peripheral circuit 175a, the second peripheral circuit 175b, and the analog circuit portion 105 as well as other various module and components, are coupled to each other by or through one or more data buses (shown schematically in FIG. 1 as block 180). The data bus 180 enables the transfer of data signals (shown as dashed lines in FIG. 1) between the components of the mixed-signal electronic circuit 100.

The electronic processor 165 controls the other components of the mixed-signal electronic circuit 100. The electronic processor 165 obtains and provides information (for example, from a memory or an input/output interface (not shown)), and processes the information by executing one or more software instructions or modules, capable of being stored, for example, in a random access memory ("RAM"), for example, during execution, or a read only memory ("ROM"), for example, on a generally permanent basis, or another non-transitory computer readable medium. The software can include firmware, one or more applications, program data, filters, rules, one or more program modules, and other executable instructions.

The first and second peripheral circuits 175a and 175b each include combinations of hardware and software that execute specific instructions to perform certain specialized functions such as, for example perform mathematical operations on input signals, access data and/or databases based on input signals, generate visual, auditory, and/or haptic outputs, generate messages to the electronic processor 165 and/or other peripheral circuits, output location information based on input signals, and other functions relating to the operation of the device in which the mixed-signal electronic circuit 100 is incorporated. The functions performed by the first peripheral circuit 175a and/or the second peripheral circuit 175b may change according to the specific implementation of the mixed-signal electronic circuit 100 within a larger computing or communications device (for example, a two-way radio). In the embodiment illustrated in FIG. 1, the first peripheral circuit 175a receives digitized signals from the analog circuit portion 105. The second peripheral circuit 175b, on the other hand, outputs digital control signals to the analog circuit portion 105. Although the exemplary embodiment of FIG. 1 only illustrates two peripheral circuits (namely, the first peripheral circuit 175a and the second peripheral circuit 175b), in other embodiments, the digital circuit portion 110 may include more or fewer peripheral circuits. In addition, the peripheral circuits may be configured to perform functions that are different than those described herein with respect to the first peripheral circuit 175a and the second peripheral circuit 175b.

The master clock generator 170a generates a source clock signal 205 (shown in FIG. 2) at a first frequency. The master clock generator 170a is electrically coupled to the processor clock generator 170b, the first peripheral clock generator 170c, and the second peripheral clock generator 170d. The master clock generator 170a sends the source clock signal 205 to the processor clock generator 170b, the first peripheral clock generator 170c, and the second peripheral clock generator 170d. Clock signal connections to and from each of the clock generators 170a through 170d are illustrated by solid lines in FIG. 1.

The processor clock generator 170b receives the source clock signal 205, processes and/or modifies (for example, changes the frequency) the source clock signal 205, and generates an output clock signal. The processor clock generator 170b provides the output clock signal to the electronic processor 165 and to the data bus 180. The output clock signal from the processor clock generator 170b drives the electronic processor 165 and/or the data bus 180. The first peripheral clock generator 170c receives the source clock signal 205, processes and/or modifies the source clock signal 205, and provides an output clock signal to the first peripheral circuit 175a. The output clock signal from the first peripheral clock generator 170c drives the first peripheral circuit 175a. The second peripheral clock generator 170d receives the source clock signal 205, processes and/or modifies the source clock signal 205, and provides an output clock signal to the second peripheral circuit 175b. The output clock signal from the second peripheral clock generator 170d drives the second peripheral circuit 175b.

Figure 2:
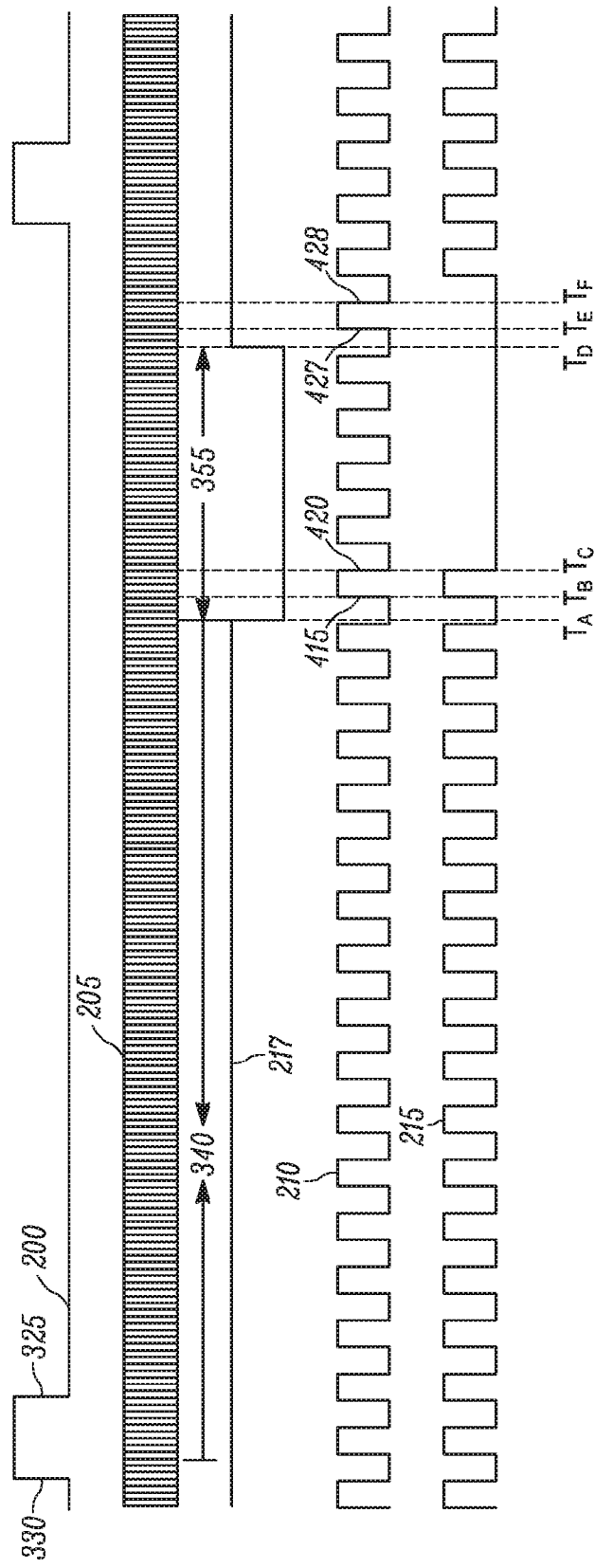
FIG. 2 illustrates exemplary waveforms and timing of the signals generated by the mixed-signal electronic circuit of FIG. 1.

FIG. 2 illustrates exemplary waveforms of the signals monitored and generated by the mixed-signal electronic circuit of FIG. 1. In particular, FIG. 2 illustrates the trigger clock signal 200 generated by the clock generator 120 of the analog circuit portion 105, and the source clock signal 205 generated by the master clock generator 170a. FIG. 2 also illustrates a divided clock signal 210 generated by, for example, the first peripheral clock generator 170c, and an output clock signal 215 generated by, for example, the first peripheral clock generator 170c. Finally, FIG. 2 illustrates a blanking signal 217 used to control a clock generator to blank the output clock signal 215.

In the illustrated example, the first peripheral clock generator 170c receives the source clock signal 205 from the master clock generator 170a, and generates the divided clock signal 210 based on the source clock signal 205. The divided clock signal 210 has a lower frequency than the source clock signal 205 and is used to generate the output clock signal 215. In other words, the first peripheral clock generator 170c modifies the source clock signal 205 (for example, lowers the frequency of the source clock signal 205) to generate the divided clock signal 210. The first peripheral clock generator 170c may then modify or process the divided clock signal 210 (for example, may suspend the divided clock signal 210 as described in more detail below) to generate the output clock signal 215. In the illustrated embodiment, the source clock signal 205 has a first frequency that is higher than the divided clock signal 210 and the output clock signal 215 to allow each clock generator 170b through 170d to modify the source clock signal 205 differently.

In some embodiments, the divided clock signal 210 and the output clock signal 215 are generated by a different clock generator instead of the first peripheral clock generator 170c. For example, in some embodiments, the divided clock signal 210 and the output clock signal 215 may be generated by the master clock generator 170a. In such embodiments, the output clock signal 215 is forwarded to the processor clock generator 170b, to the first peripheral clock generator 170c, and to the second peripheral clock generator 170d. In other examples, the divided clock signal 210 and the output clock signal 215 may be generated by the processor clock generator 170b. In yet other examples, the divided clock signal 210 and the output clock signal 215 are generated by the second peripheral clock generator 170d or another peripheral clock generator. The waveforms and timing information of FIG. 2 are referenced in the discussion of FIGS. 3 through 4 that follows below.

Figure 3:
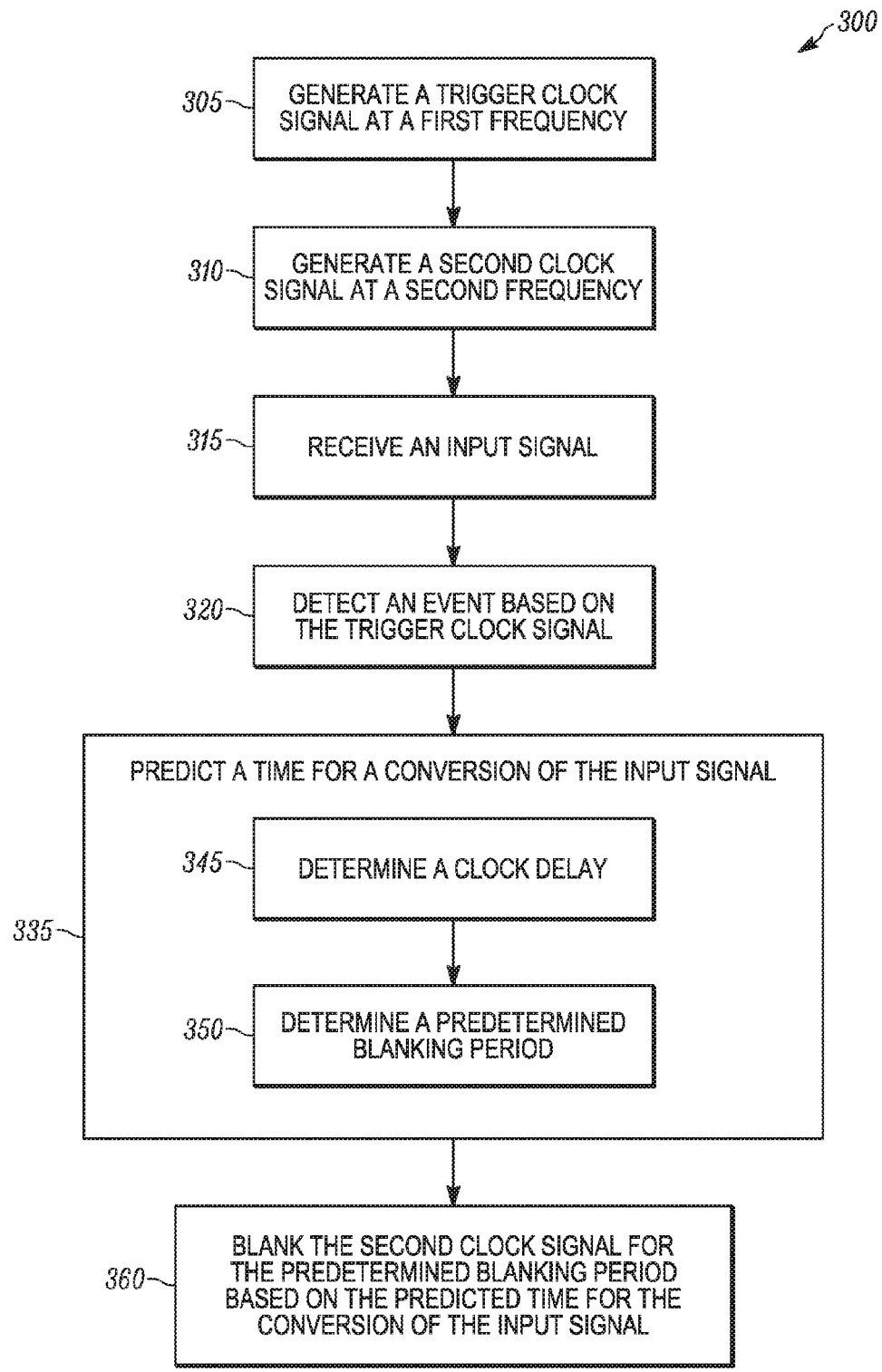
FIG. 3 is a flowchart of an exemplary method of mitigating electromagnetic noise in an electronic device.

FIG. 3 is a flowchart of a method 300 of mitigating electromagnetic noise in an electronic device in accordance with an exemplary embodiment. First, the clock generator 120 (for example, a first clock generator) of the analog circuit portion 105 generates a trigger clock signal (for example, the trigger clock signal 200 shown in FIG. 2) at a first frequency (block 305). The trigger clock signal 200 sets a trigger for the radio transceiver 115 to process incoming (for example, analog) and outgoing (for example, digital) signals. Meanwhile, the first peripheral clock generator 170c (for example, a second clock generator) generates a second clock signal (for example, the output clock signal 215 shown in FIG. 2) at a second frequency (block 310). Since the second clock signal (for example, the output clock signal 215) drives the first peripheral circuit 175a, the second frequency is higher than the first frequency of the trigger clock signal 200. The difference in frequency between the output clock signal 215 and the trigger clock signal 200 is illustrated in FIG. 2.

The converter circuit 150 processes an input signal based on the trigger clock signal 200 (block 315). As discussed above with respect to FIG. 1, the input signal to the converter circuit 150 may be an analog signal or a digital signal. The converter circuit 150 digitizes the input signal when the input signal is an analog signal, and the converter circuit 150 converts the input signal to an analog signal when the input signal is a digital signal. The operations performed by the converter circuit 150 may be adversely impacted by electromagnetic noise. The trigger clock signal 200 generated by the clock generator 120 drives the conversion of the input signal by the converter circuit 150. The first peripheral clock generator 170c detects an event based on the trigger clock signal 200 (block 320). In particular, the first peripheral clock generator 170c detects a falling edge 325 or a rising edge 330 of the trigger clock signal 200. Then, based on the detected event, the first peripheral clock generator 170c predicts a time for a conversion of the input signal by the converter circuit 150 (block 335).

In the exemplary embodiment of FIG. 3, predicting a time for a conversion of the input signal includes determining a clock delay (block 345), such as, for example, the clock delay 340 of FIG. 2, and determining a predetermined blanking period (block 350), such as, for example, the predetermined blanking period 355 of FIG. 2. The clock delay 340 corresponds to a delay before a next conversion of the input signal by the converter circuit 150. In the example of FIG. 2, the clock delay 340 is approximately 15 clock cycles as measured by the divided clock signal 210 and is approximately 127 clock cycles as measured by the source clock signal 205. In other implementations, however, the clock delay 340 may be shorter or longer than the 15 clock cycles as measured by the divided clock signal 210 and the 127 clock cycles as measured by the source clock signal 205. In the illustrated example, the clock delay 340 is measured, saved, and counted based on the clock cycles of the source clock signal 205. In other embodiments, however, the clock delay 340 is measured, saved, and counted based on the clock cycles of the divided clock signal 210. Determining the clock delay 340 may include, for example, calculating the clock delay 340 based on characteristics of the input signal, the converter circuit 150, the digital circuit portion 110, and the like. In some embodiments, determining the clock delay 340 may include accessing a clock delay 340 from memory, receiving the clock delay 340 from a different electronic component (e.g., the electronic processor 165), or receiving the clock delay 340 from a user.

The predetermined blanking period 355 corresponds to a period during which the second clock signal (for example, the output clock signal 215) is suspended (or blanked). As shown in the exemplary waveforms of FIG. 2, the output clock signal 215 (that is, the second clock signal) generated by the first peripheral clock generator 170c does not exhibit the clock transitions during the predetermined blanking period 355. In an exemplary embodiment, the predetermined blanking period 355 also corresponds to an amount of time for the converter circuit 150 to execute the conversion of the input signal. In the example of FIG. 2, the predetermined blanking period 355 is approximately five clock cycles as measured by the divided clock signal 210. The predetermined blanking period 355 is approximately 41 clock cycles as measured by the source clock signal 205. In other examples, the predetermined blanking period may be shorter or longer than the blanking period of FIG. 2. In the illustrated example, the predetermined blanking period 355 is measured, saved, and counted based on the clock cycles of the source clock signal 205. In other embodiments, however, clock cycles of other clock signals may be used to measure, save, and count the predetermined blanking period 355. Additionally, as mentioned previously with respect to block 345, determining the predetermined blanking period 355 may include calculating the predetermined blanking period 355, retrieving the predetermined blanking period 355 from a memory, and/or receiving the predetermined blanking period 355 from another electronic component (for example, the electronic processor 165) or from a user.

After the first peripheral clock generator 170c predicts a time for a conversion of the input signal, the first peripheral clock generator 170c blanks the second clock signal (for example, the output clock signal 215) for the predetermined blanking period 355 based on the predicted time for a conversion of the input signal (block 360).

Figure 4:
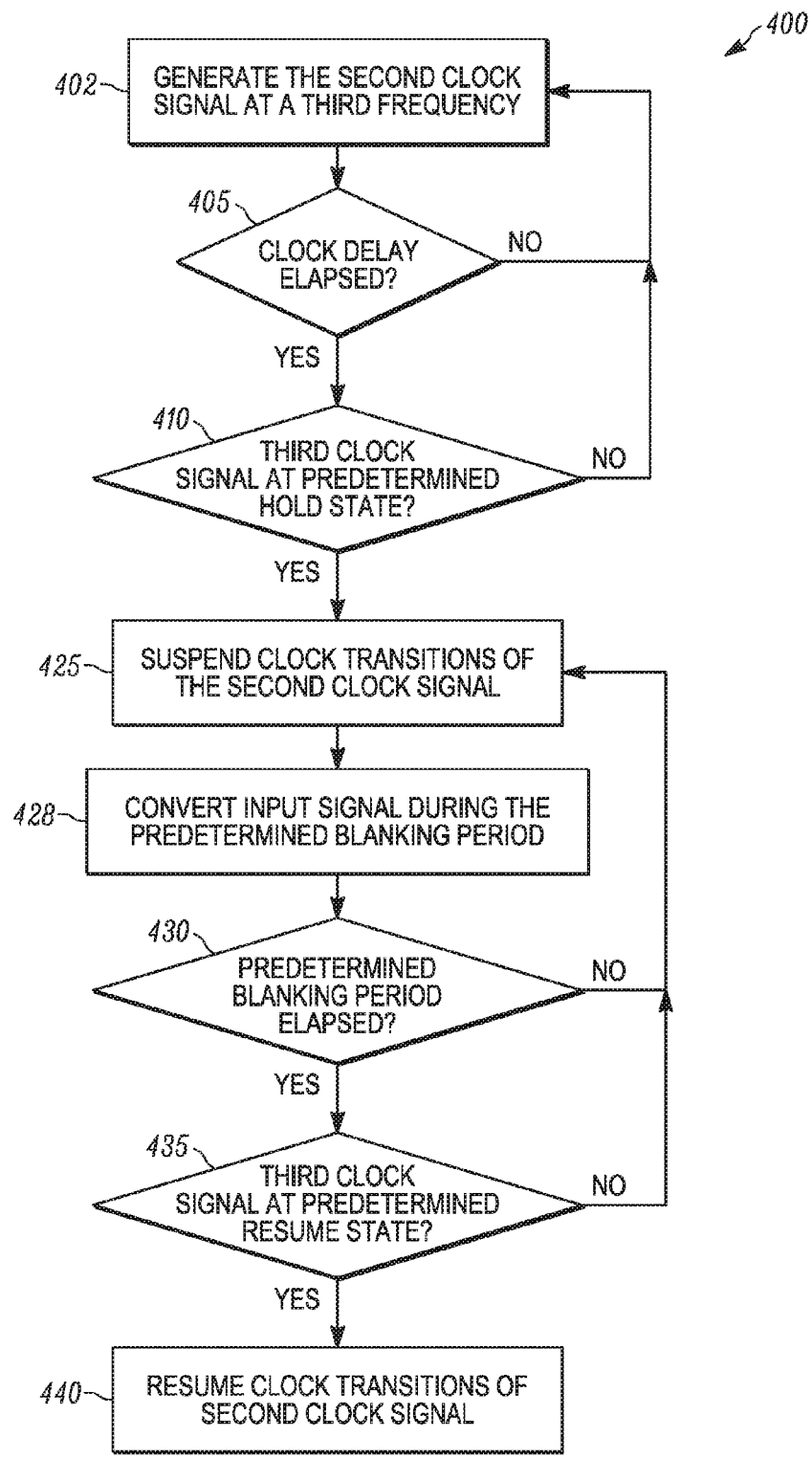
FIG. 4 is a flowchart of an exemplary method of blanking a clock signal.

FIG. 4 illustrates one exemplary method 400 of blanking the second clock signal as described with respect to block 360. In the method 400 of FIG. 4, the first peripheral clock generator 170c generates the second clock signal and a third clock signal (for example, the output clock signal 215 and the divided clock signal 210, respectively) (block 402). The first peripheral clock generator 170c then determines whether the clock delay 340 has elapsed (block 405). When the clock delay 340 elapses, the blanking signal 217 switches from a logic high signal to a logic low signal as shown in FIG. 2. The first peripheral clock generator 170c determines whether the clock delay 340 has elapsed by checking the blanking signal 217 at the rising edges of the third clock signal (for example, the divided clock signal 210). When the first peripheral clock generator 170c determines that the clock delay 340 has not yet elapsed (that is the blanking signal 217 remains logic high) the first peripheral clock generator 170c continues to generate the second clock signal and the third clock signal (block 402). On the other hand, when the first peripheral clock generator 170c determines that the clock delay 340 has elapsed (that is, detects that the blanking signal 217 is logic low), the first peripheral clock generator 170c determines whether the third clock signal (for example, the divided clock signal 210) is at a predetermined hold state (block 410). In the example illustrated in FIG. 2, the clock delay 340 elapses at time $T_A$, at which time the blanking signal 217 switches from logic high to logic low. Since the first peripheral clock generator 170c checks the blanking signal 217 at the rising edges, the first peripheral clock generator 170c detects the logic low blanking signal 217 at time $T_B$ at the rising edge 415. As described above, the first peripheral clock generator 170c then determines whether the third clock signal is at the predetermined hold state. In the illustrated example of FIG. 2, the predetermined hold state corresponds to a falling edge 420 (also referred to as a negative edge) of the divided clock signal 210. In other examples, first peripheral clock generator 170c checks the blanking signal 217 at the falling edges, and, in such embodiments, the predetermined hold state may correspond to a rising edge (also referred to as a positive edge) of the divided clock signal 210.

When the first peripheral clock generator 170c determines that the second clock signal is not at the predetermined hold state, the first peripheral clock generator 170c continues to generate the second clock signal and the third clock signal (block 402) until the third clock signal changes to the predetermined hold state. In the example of FIG. 2, the first peripheral clock generator 170c continues to generate the clock transitions of the divided clock signal 210 until the divided clock signal 210 reaches the predetermined hold state (for example, the falling edge 420 of the divided clock signal) at time $T_C$. When the first peripheral clock generator 170c determines that the third clock signal reaches the predetermined hold state, the first peripheral clock generator 170c suspends the clock transitions of the second clock signal (block 425). In the example shown in FIG. 2, the first peripheral clock generator 170c blanks the output clock signal 215 during the predetermined blanking period 355. Because the first peripheral clock generator 170c waits for the divided clock signal 210 to reach the predetermined hold state (that is, the falling edge 420 in this example), the output clock signal 215 may not be suspended immediately when the clock delay 340 elapses and the predetermined blanking period 355 begins, or even when the first peripheral clock generator 170c detects the logic low blanking signal 217. In the example shown in FIG. 2, the predetermined blanking period begins at time $T_A$, the first peripheral clock generator 170c, however, detects the logic low blanking signal 217 at time $T_B$, and the output clock signal 215 is not blanked (that is, the output clock signal 215 is not suspended) until the third clock signal (that is, the divided clock signal 210) reaches the falling edge 420, at time $T_C$. Checking the blanking signal 217 at one type of edge (for example, the rising edge 415), and waiting for the third clock signal (for example, the divided clock signal 210) to reach the predetermined hold state (for example, the falling edge 420) reduces jitter in the clock signal and ensures a smooth transition between generating a clock signal and suspending generation of a clock signal.

The converter circuit 150 converts the input signal during the predetermined blanking period 355 (block 428). Because at least one or more clock signals from the digital circuit portion 110 are blanked (that is, one or more of the clock generators from the digital circuit portion 110 do not generate a respective output clock signal) during the predetermined blanking period 355, the noise generated by the clock signals from the digital circuit portion 110 is reduced. The reduced noise generated by the clock signals thereby increases the signal-to-noise ratio of the input signal and increases the accuracy of the conversion of the input signal. Because the conversion of the input signal is synchronous, the master clock generator 170a, the processor clock generator 170b, the first peripheral clock generator 170c, and the second peripheral clock generator 170d can predict, based on the trigger clock signal 200, an appropriate time to blank selected clock signals.

After the first peripheral clock generator 170c blanks the second clock signal for the predetermined blanking period 355, the first peripheral clock generator 170c resumes generation of the second clock signal as generally illustrated by blocks 430 through 440 of FIG. 4, which are described below in more detail. In particular, the first peripheral clock generator 170c determines whether the predetermined blanking period 355 has elapsed (block 430). As discussed above, the first peripheral clock generator 170c checks the blanking signal 217 on the rising edges of the third clock signal 210 to determine when the predetermined blanking period 355 has elapsed. When the first peripheral clock generator 170c determines that the predetermined blanking period 355 has not yet elapsed (for example, the blanking signal 217 remains logic low), the first peripheral clock generator 170c continues to blank the second clock signal (block 425). On the other hand, when the first peripheral clock generator 170c detects, on a rising edge, that the blanking signal 217 switches from a logic low signal to a logic high signal, the first peripheral clock generator 170c determines that the predetermined blanking period 355 has elapsed. In the example of FIG. 2, the predetermined blanking period 355 elapses at time $T_D$, and the first peripheral clock generator 170c determines that the blanking period 355 has elapsed at rising edge 427 at time $T_E$. The first peripheral clock generator 170c then determines whether the third clock signal (for example, the divided clock signal 210) is at a predetermined resume state (block 435). In the example shown in FIG. 2, the predetermined resume state is the same as the predetermined hold state. That is, the predetermined resume state also corresponds to a falling edge of the third clock signal (for example, falling edge 428 of the divided clock signal 210).

When the third clock signal is not at the predetermined resume state, the first peripheral clock generator 170c continues to blank the second clock signal (block 425). When the third clock signal reaches the predetermined resume state, the first peripheral clock generator 170c resumes the generation of the clock transitions of the second clock signal (block 440). As shown in the example of FIG. 2, the predetermined blanking period ends at time $T_D$, and the first peripheral clock generator 170c detects the logic high blanking signal 217 at time $T_E$. Then, the first peripheral clock generator 170c waits for the divided clock signal 210 to reach the falling edge 428 (that is, the predetermined resume state) before the first peripheral clock generator 170c resumes generation of the clock transitions. Therefore, the output clock signal 215 resumes the clock transitions at time $T_F$, after the first peripheral clock generator 170c detects the falling edge 428 of the divided clock signal 210. Similar to waiting for the divided clock signal 210 to reach the predetermined hold state before blanking the divided clock signal 210, waiting for the divided clock signal 210 to reach the predetermined resume state (for example, the falling edge 415) reduces jitter of the output clock signal 215.

Although FIGS. 2 through 4 have been described with respect to the first peripheral clock generator 170c generating and blanking the second clock signal, in other embodiments, the master clock generator 170a performs the methods 300 and 400 described with respect to FIGS. 2 through 4. In such embodiments, when the master clock generator 170a blanks the second clock signal, the processor clock generator 170b, the first peripheral clock generator 170c, and the second peripheral clock generator 170d, as well as any other clock generators driven by the master clock generator 170a stop generating any output clock signals. Therefore, by blanking the output clock signal from the master clock generator 170a, the clocks on the digital circuit portion 110 also stop generating output clock signals.

In yet another embodiment, the processor clock generator 170b executes the methods 300 and 400 described with respect to FIGS. 2 through 4. In such embodiments, the first peripheral clock generator 170c, the second peripheral clock generator 170d, and other peripheral clock generators continue to generate respective output clock signals.

Although the steps of methods 300 and 400 are illustrated as occurring serially, one or more of the steps are executed simultaneously in some instances. Furthermore, the steps of methods 300 and 400 may be executed in a different order than that illustrated in FIGS. 3 through 4.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of mitigating electromagnetic noise in an electronic device, the method comprising:
    generating a trigger clock signal at a first frequency;
    generating a second clock signal at a second frequency, the second frequency being higher than the first frequency;
    receiving an input signal with a converter circuit;
    detecting an event based on the trigger clock signal;
    predicting a time for a conversion of the input signal based on the event, wherein conversion of the input signal includes one selected from a group consisting of converting an analog signal to a digital signal and converting a digital signal to an analog signal; and
    blanking the second clock signal for a predetermined period based on the predicted time for the conversion.

2. The method of claim 1, wherein predicting the time for the conversion of the input signal includes determining a clock delay corresponding to a delay before the conversion of the input signal by the converter circuit.

3. The method of claim 1, further comprising converting the input signal with the converter circuit while the second clock signal is blanked.

4. The method of claim 1, wherein blanking the second clock signal for the predetermined period includes determining whether the clock delay has elapsed since the detected event, and when the clock delay has elapsed, blanking the second clock signal for the predetermined period.

5. The method of claim 1, wherein detecting the event based on the trigger clock signal includes detecting one of a group consisting of a rising edge and a falling edge of the trigger clock signal.

6. The method of claim 1, further comprising resuming generation of the second clock signal after the predetermined period has elapsed.

7. The method of claim 6, further comprising:
generating a third clock signal at the second frequency, and
wherein blanking the second clock signal for the predetermined period includes
determining whether the third clock signal is at a predetermined hold state, and
when the third clock signal is at the predetermined hold state, blanking the second clock signal for the predetermined period; and
wherein resuming generation of the second clock signal includes
determining whether the third clock signal is at a predetermined resume state, and
when the third clock signal is at the predetermined resume state, resuming generation of the second clock signal.

8. The method of claim 1, wherein blanking the second clock signal includes interrupting a master digital clock generator.

9. The method of claim 1, wherein blanking the second clock signal includes interrupting a peripheral clock controlling intra-chip interfacing.

10. A mixed-signal circuit comprising:
a first clock generator configured to generate a trigger clock signal at a first frequency;
a converter circuit configured to receive an input signal;
a second clock generator configured to
generate a second clock signal at a second frequency, the second frequency being higher than the first frequency,
detect an event based on the trigger clock signal,
predict a time for a conversion of the input signal based on the detected event, wherein conversion of the input signal includes one selected from a group consisting of converting an analog signal to a digital signal and converting a digital signal to an analog signal, and
blank the second clock signal for a predetermined period based on the predicted time for the conversion.

11. The mixed-signal circuit of claim 10, wherein the second clock generator is configured to determine a clock delay corresponding to a delay before the conversion of the input signal by the converter circuit.

12. The mixed-signal circuit of claim 10, wherein the converter circuit is configured to convert the input signal while the second clock signal is blanked.

13. The mixed-signal circuit of claim 11, wherein the second clock generator is configured to determine whether the clock delay has elapsed since the detected event, and wherein the second clock generator blanks the second clock signal for the predetermined period when the clock delay has elapsed.

14. The mixed-signal circuit of claim 10, wherein the event includes one of a group consisting of a rising edge of the trigger clock signal and a falling edge of the trigger clock signal.

15. The mixed-signal circuit of claim 10, wherein the second clock generator is configured to resume generation of the second clock signal after the predetermined period has elapsed.

16. The mixed-signal circuit of claim 15, wherein the second clock generator is configured to
generate a third clock signal, and
determine whether the third clock signal is at a predetermined hold state,
wherein the second clock generator starts to blank the second clock signal when the third clock signal is at the predetermined hold state,
determine whether the third clock signal is at a predetermined resume state, and
wherein the second clock generator resumes generation of the second clock signal when the third clock signal is at the predetermined resume state.

17. The mixed-signal circuit of claim 10, wherein the second clock generator includes a master digital clock generator.

18. The mixed-signal circuit of claim 10, wherein the second clock generator includes a peripheral clock generator controlling intra-chip interfacing.

* * * * *